(12) United States Patent
Fan

(10) Patent No.: US 6,909,608 B2
(45) Date of Patent: Jun. 21, 2005

(54) HEAT SINK ASSEMBLY WITH HEAT PIPE

(75) Inventor: Wei-Feng Fan, Taipei (TW)

(73) Assignee: Datech Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/609,541

(22) Filed: Jul. 1, 2003

(65) Prior Publication Data

US 2004/0165350 A1 Aug. 26, 2004

(30) Foreign Application Priority Data

Feb. 25, 2003 (TW) ........................................ 92202939 U

(51) Int. Cl.$^7$ ................................................. H05K 7/20
(52) U.S. Cl. .......................... 361/700; 361/690; 361/695; 361/699; 361/719; 257/715; 257/722; 174/15.2; 165/80.3; 165/80.4; 165/104.21; 165/104.33
(58) Field of Search ................................. 361/697–699, 361/700, 704, 707, 709; 257/715, 722; 174/15.2, 15.1; 165/80.4, 104.26, 104.33, 80.3, 185

(56) References Cited

U.S. PATENT DOCUMENTS

| | | | |
|---|---|---|---|
| 6,189,610 B1 | | 2/2001 | LaClare et al. |
| 6,263,957 B1 | * | 7/2001 | Chen et al. ................ 165/80.4 |
| 6,288,896 B1 | | 9/2001 | Hsu |
| 6,360,814 B1 | * | 3/2002 | Tanaka et al. .......... 165/104.33 |
| 6,394,175 B1 | * | 5/2002 | Chen et al. ................. 165/80.3 |
| 6,410,982 B1 | | 6/2002 | Brownell et al. |
| 6,459,584 B1 | * | 10/2002 | Kuo ............................ 361/704 |
| 6,598,667 B1 | * | 7/2003 | Kuo ............................ 165/80.3 |
| 6,600,649 B1 | * | 7/2003 | Tsai et al. .................... 361/697 |
| 6,651,734 B1 | * | 11/2003 | Liu .............................. 165/80.3 |
| 6,745,824 B2 | * | 6/2004 | Lee et al. .............. 165/104.14 |
| 2003/0140636 A1 | * | 7/2003 | Van Winkle ................. 62/3.61 |
| 2004/0037039 A1 | * | 2/2004 | Shimura et al. ............ 361/700 |

FOREIGN PATENT DOCUMENTS

| TW | 505379 | 11/1990 |
|---|---|---|
| TW | 504132 | 12/1990 |

* cited by examiner

Primary Examiner—Boris Chervinsky
(74) Attorney, Agent, or Firm—Troxell Law Office, PLLC

(57) ABSTRACT

The present invention provides a heat sink assembly. The heat sink assembly comprises a first heat sink with a fan disposed therein, a second heat sink and a heat pipe. The heat pipe has two ends respectively being disposed inside the first heat sink and the second heat sink, The heat pipe is disposed in a side of the first heat sink and the second heat sink and connects the first heat sink and the second heat sink with a space therein for positioning the fan. Therefore, the first heat sink and the second heat sink become a main heat-dissipating region and a sub heat-dissipating region. Heat is dissipated first in the first heat sink (the main heat-dissipating region) and then transferred via the heat pipe to the second heat sink (the sub heat-dissipating region) for being dissipated again.

3 Claims, 5 Drawing Sheets

HEAT SINK ASSEMBLY WITH HEAT PIPE

REFERENCE CITED
1. Taiwan patent No.: 505379.
2. Taiwan Patent No.: 504132.
3. U.S. Pat. No. : 6,288,896.
4. U.S. Pat. No. : 6,410,982.
5. U.S. Pat. No. : 6,189,601.

FIELD OF THE INVENTION

The present invention is related to a heat sink assembly with a heat pipe. More particularly, the first heat sink and the second heat sink become a main heat-dissipating region and a sub heat-dissipating region. Heat is dissipated first in the first heat sink (the main heat-dissipating region) and then transferred via the heat pipe to the second heat sink (the sub heat-dissipating region) for being dissipated again.

BACKGROUND OF THE INVENTION

Generally speaking, conventional heat-dissipating apparatus is composed of a heat sink and a fan disposed in the heat sink for absorbing heat in central processing unit (CPU) and blowing or guiding air flow to dissipate heat. As the computer technology progresses, equipments and devices in personal computer field substantially vary. Multimedia logic arithmetic process data become much huge and operating speed becomes relatively faster. Accordingly, the operation temperature of inner equipments of personal computers and integrated circuit devices lend to increase, and sometimes, even chips in the interface cards may generate huge heat when operating. Therefore, normal operations may possibly be influenced if heat can not be timely dissipated. It will also result in low operating speed or damage its operating life. That is, conventional heat-dissipating apparatus is not really useful for dissipating heat, Accordingly, designers in the field provides a heat-dissipating apparatus, disclosed in the Taiwan Patent No. 505379, including a substrate; a plurality of heat sink fins, said heat sink fins are set up straight and are spaced at intervals on the substrate, and each of heat sink fins has a plurality of first protrusions and a plurality of second protrusions, adjacent first protrusions and second protrusions connect together in the form of successive waves.

Meanwhile, the heat-dissipating apparatus, disclosed in Taiwan Patent No. 504132, includes a heat sink with a base underneath, disposed on metal materials, which is characterized in that: a arc-shaped air flow channel is disposed between the heat sink fins. A base is formed from the arc-shaped air flow channel between each of the heat sink fins to the bottom of th metal materials. Due to the arc-shaped air flow channel, the base becomes a partition with arc-shaped sides.

Even though the above heat-dissipating apparatuses have capacity of dissipating heat, the heat-dissipating apparatus is only composed of a single heat sink cooperating with a fan. The dissipation capacity of this kind of heat-dissipating apparatus can be improved slightly, even with different constructions. Therefore, when the fan above the heat sink leads air flow to the heat sink, the air flow will blow right down. Since the heat sink mentioned above has a plurality of crossed channels, when the air flow blow to the bottom of the heat sink, the air flow will rebound from the bottom of the heat sink. Thus, the airflow will be dispersed in the crossed channels. Some part of the heat sink can not be blown by air flow, and therefore, some parts of the heat sink are not heat-dissipated. Accordingly, the above method of dissipating heat is not useful and can not dissipate heat fully. Low operating efficiency and crash conditions still occur due to overheat of CPU. That is, the conventional method is insufficient for user's needs. The conventional construction is also not effective for realistic practice.

SUMMARY OF THE INVENTION

The main objective of the present Invention is to provide a main heat-dissipating region and a sub heat-dissipating region. Heat is dissipated first in the first heat sink (the main heat-dissipating region) and then transferred via the heat pipe to the second heat sink (the sub heat-dissipating region) for being dissipated again.

To achieve the above objective, a heat sink assembly with a heat pipe is provided, including a first heat sink with a fan disposed therein, a second heat sink and the heat pipe, the heat pipe has two ends respectively being disposed inside the first heat sink and the second heat sink. The heat pipe is disposed in a side of the first heat sink and the second heat sink and connects the first heat sink and the second heat sink with a space therein for positioning the fan.

Therefore, the first heat sink and the second heat sink become a main heat-dissipating region and a sub heat-dissipating region. Heat is dissipated first in the first heat sink (the main heat-dissipating region) and then transferred via the heat pipe to the second heat sink (the sub heat-dissipating region) for being dissipated again.

BRIEF DESCRIPTION OF THE DRAWINGS

The present Invention will be better understood from the following detailed description of preferred embodiments of the invention, taken in conjunction with the accompanying drawings, in which.

DETAILED DESCRIPTION OF THE INVENTION

To achieve the above described objectives of the present invention, techniques, methods, specific characteristics and configuration of the present invention will be fully understood by means of a preferred exemplary embodiment with accompanying drawings is described as follows.

Figure 1:
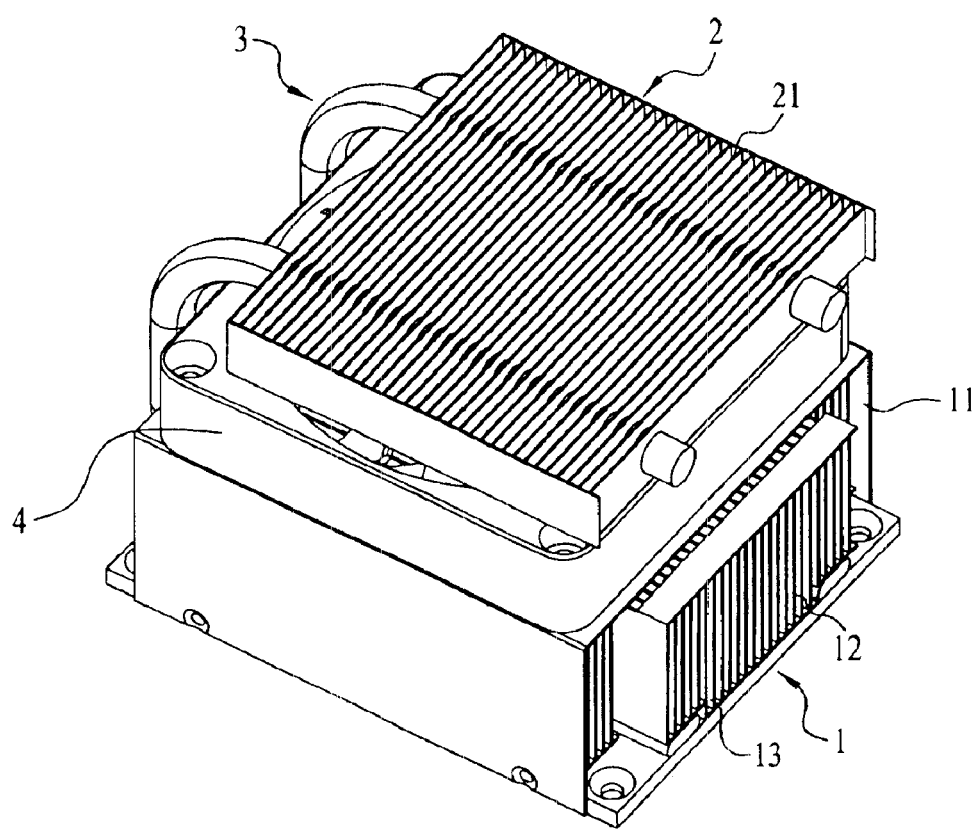
FIG. 1 is a view showing exterior of the present invention.
Figure 2:
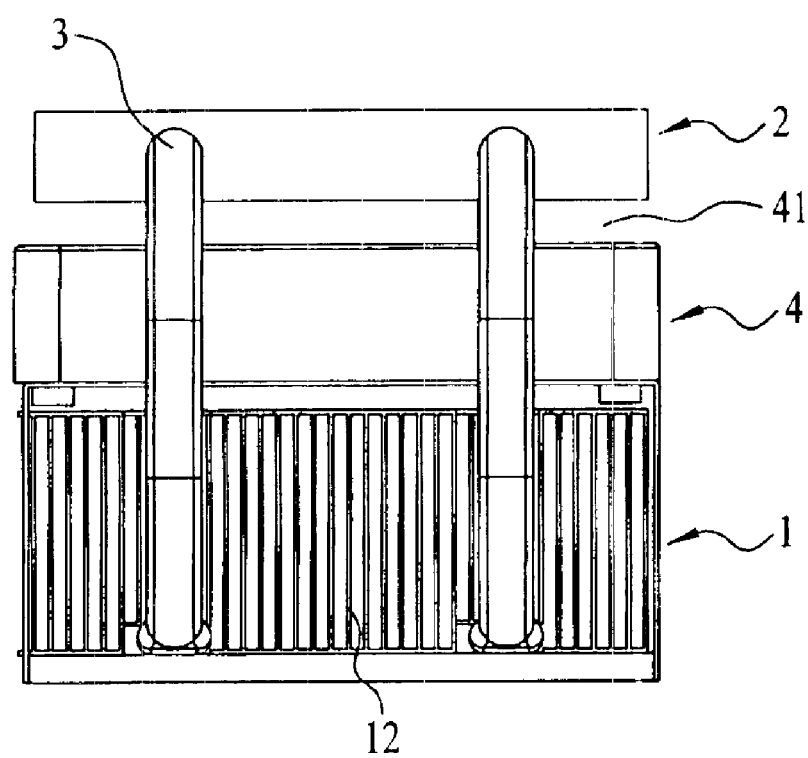
FIG. 2 is a side view of the present invention.
Figure 3:
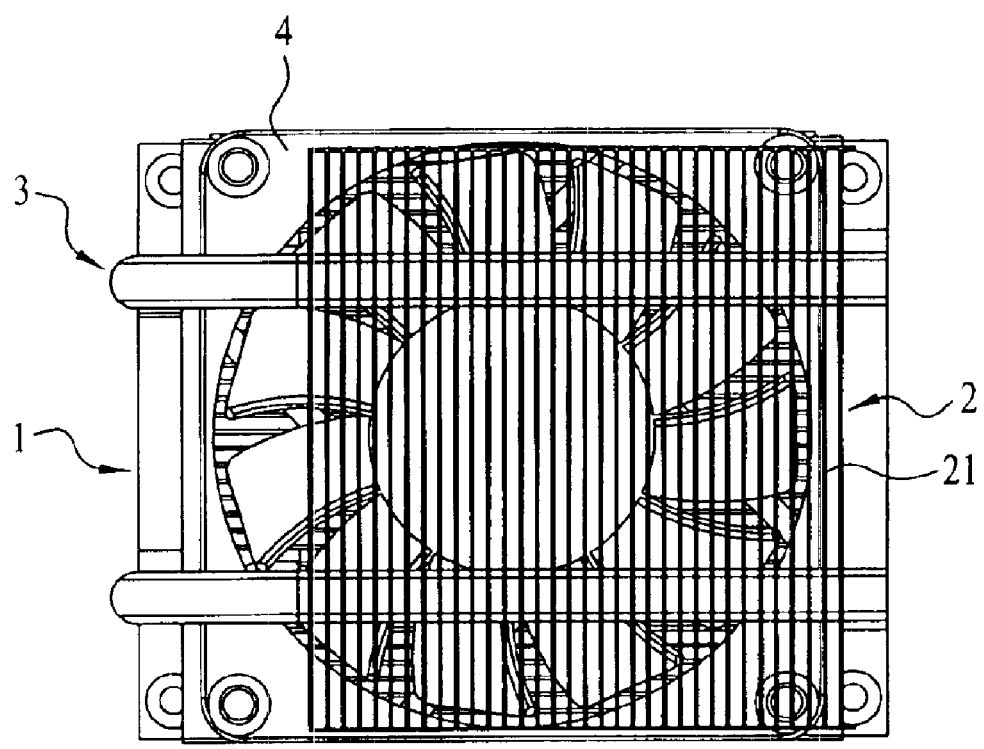
FIG. 3 is a top plan view of the present Invention.

FIG. 1, FIG. 2 and FIG. 3 respectively are a view showing exterior of the present invention, a side view of the present invention and a top plan view of the present invention. As shown in the diagrams, the present invention provides a heat sink assembly with a heat pipe, composed of a first heat sink 1, a second heat sink 2 and a heat pipe 3. The first heat sink 1 and the second heat sink 2 become a main heat-dissipating region and a sub heat-dissipating region. Heat is dissipated first in the first heat sink 1 (the main heat-dissipating region) and then transferred via the heat pipe 3 to th second heat sink 2 (the sub heat-dissipating region) for being dissipated again.

A fan 4 is disposed on the first heat sink 1 mentioned above. The first heat sink 1 is composed of a frame body 11 and a plurality of heat sink fine 12 in the frame body 11. The second heat sink 2 is composed of a plurality of heat sink fins 21.

The heat pipe 3 is a tube with capillary depression. The heat pipe 3 is filled with liquid. The heat pipe 3 has two ends respectively being disposed inside the first heat sink 1 and the second heat sink 2, and respectively passing through the first heat sink 1 and the second heat sink 2. There are some bending parts in the ends of the heat pipe 3. The heat pipe 3 is disposed in a side of the first heat sink 1 and the second heat sink 2 and connects the first heat sink 1 and the second heat sink 2 via the heat pipe 3 with a space 41 therein for positioning the fan 4 in the space 41. Therefore, a whole new heat sink assembly with heat pipe is constructed.

Figure 4:
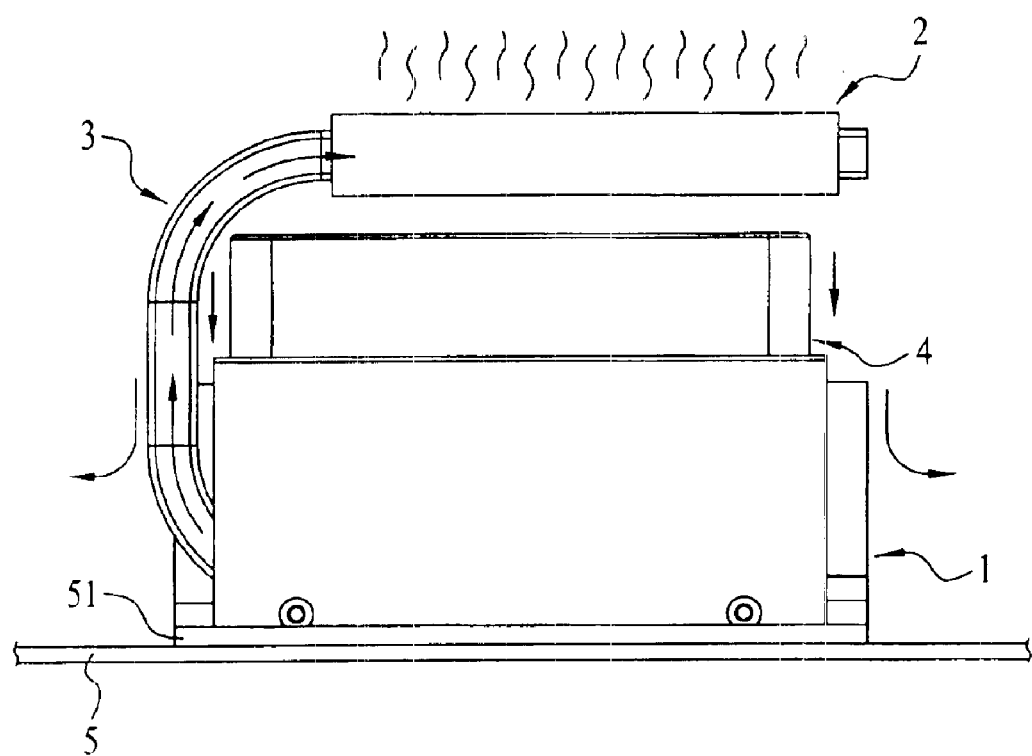
FIG. 4 is a view showing the present invention in an operation configuration.
Figure 5:
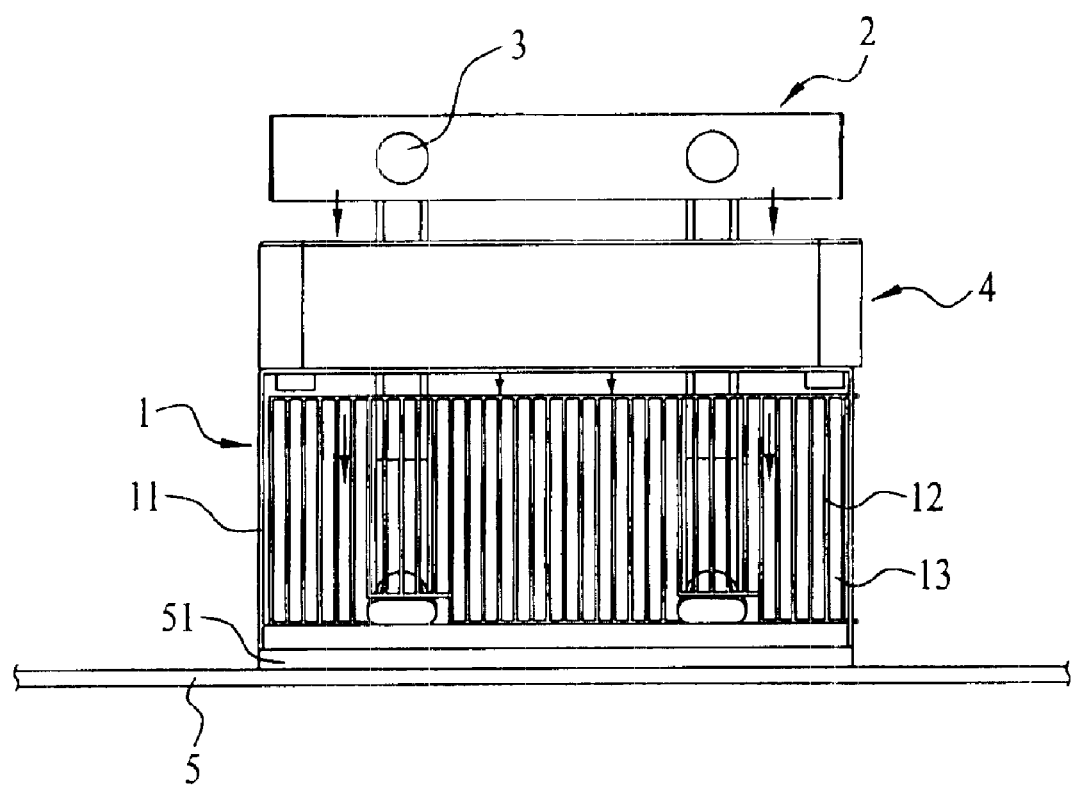
FIG. 5 is another view showing the present invention in an operation configuration.

FIG. 4 and FIG. 5 respectively are a view showing the present invention in an operation configuration, and another view showing the present invention in an operation configuration. As shown in the diagrams, the bottom of the frame body 11 of the first heat sink 1 of the present invention stays close to the CPU 51 of the circuit board 5. Thus, the first heat sink 1 can absorb the heat generated by the CPU 51 when operating. Since the bottom of the frame body 11 of the first heat sink 1 stays close to the CPU 51, the first heat sink 1 can absorb heat generated by the CPU 51 from the bottom of the frame body 11 of the first heat sink 1 and transfer heat to a plurality of heat sink fins 12 in the frame body 11. Then, by the fan 4 of the first heat sink 1, air flow from the fan 4 is leaded to a plurality of heat sink fins 12 of the first heat sink 1. The air flow from the fan 4 blows In the gaps 13 between the heat sink fins 12 and dissipates the heat inside. For the time being, the fan 4 may not be able to dissipate all heat in the first heat sink 1. The rest heat remaining in the first heat sink 1 will be transferred from the heat pipe 3 to the second heat sink 2 and be dissipated again. After absorbing the heat, the liquid in the heat pipe 3 will turn out to be vapor. After dissipating heat by the second heat sink 2, liberation of heat is occurred. The vapor, which is transformed from liquid in the heat pipe 3, will transform again into liquid via the second heat sink 2. Moreover, since the heat pipe 3 is a tube with capillary depression, liquid in the bent heat pipe 3 generates a wonderful circulation via the first heat sink 1 and the second heat sink 2 for absorbing and dissipating heat. Accordingly, the first heat sink 1 and the second heat sink 2 are capable of dissipating heat in the CPU 51 effectively and quickly. Whereby, the first heat sink 1 and the second heat sink 2 become a main heat-dissipating region and a sub heat-dissipating region. Heat generated by the CPU 51 is dissipated first in the first heat sink 1 (the main heat-dissipating region) with the fan 4 and then transferred via the heat pipe 3 to the second heat sink 2 (the sub heat-dissipating region) for being dissipated again, The present invention has been described above with reference to a preferred embodiment. However, it is not a limitation in the Invention. Various changes, modifications, and enhancements could be made therein without departing from the scope of the present invention as set forth in the following claims.

What is claimed is:

1. A heat sink assembly for dissipating heat comprising:
   a) a first heat sink having a frame body and a plurality of spaced apart heat sink fins located in the frame;
   b) a fan connected to a top of the first heat sink;
   c) a second heat sink located above the first heat sink and spaced apart from the fan; and
   d) a heat pipe having a first end passing through the plurality of spaced apart heat sink fins of the first heat sink and a second end passing through the second heat sink;
   wherein the first heat sink is a main heat-dissipating region and the second heat sink is a sub heat-dissipating region, heat is dissipated by the main heat-dissipating and the sub heat-dissipating regions.

2. The heat sink assembly according to claim 1, wherein the second heat sink includes a plurality of spaced apart heat sink fins.

3. The heat sink assembly according to claim 1, wherein the heat pipe is filled with liquid.

\* \* \* \* \*